United States Patent [19]
Ebel

[11] 4,445,205
[45] Apr. 24, 1984

[54] SEMICONDUCTOR MEMORY CORE PROGRAMMING CIRCUIT

[75] Inventor: Mark S. Ebel, Santa Clara, Calif.

[73] Assignee: National Semiconductor Corporation, Santa Clara, Calif.

[21] Appl. No.: 334,695

[22] Filed: Dec. 28, 1981

[51] Int. Cl.³ .............................................. G11C 7/00
[52] U.S. Cl. .................................................... 365/227
[58] Field of Search ............... 365/226, 227, 228, 229, 365/189, 230, 94, 104

[56] References Cited
U.S. PATENT DOCUMENTS 3,688,280  8/1972  Ayling et al. ........................ 365/227
4,151,611  4/1979  Sugawara et al. ................... 365/227

Primary Examiner—Joseph A. Popek
Attorney, Agent, or Firm—Michael J. Pollock; Paul J. Winters; Gail W. Woodward

[57] ABSTRACT

A programming pulse generating circuit, suitable for use on an electrically alterable read-only semiconductor memory, that decouples from the high voltage supply when in a standby condition so as to not draw current from the supply. Alternative voltage supply connections are effected by depletion mode devices.

8 Claims, 1 Drawing Figure

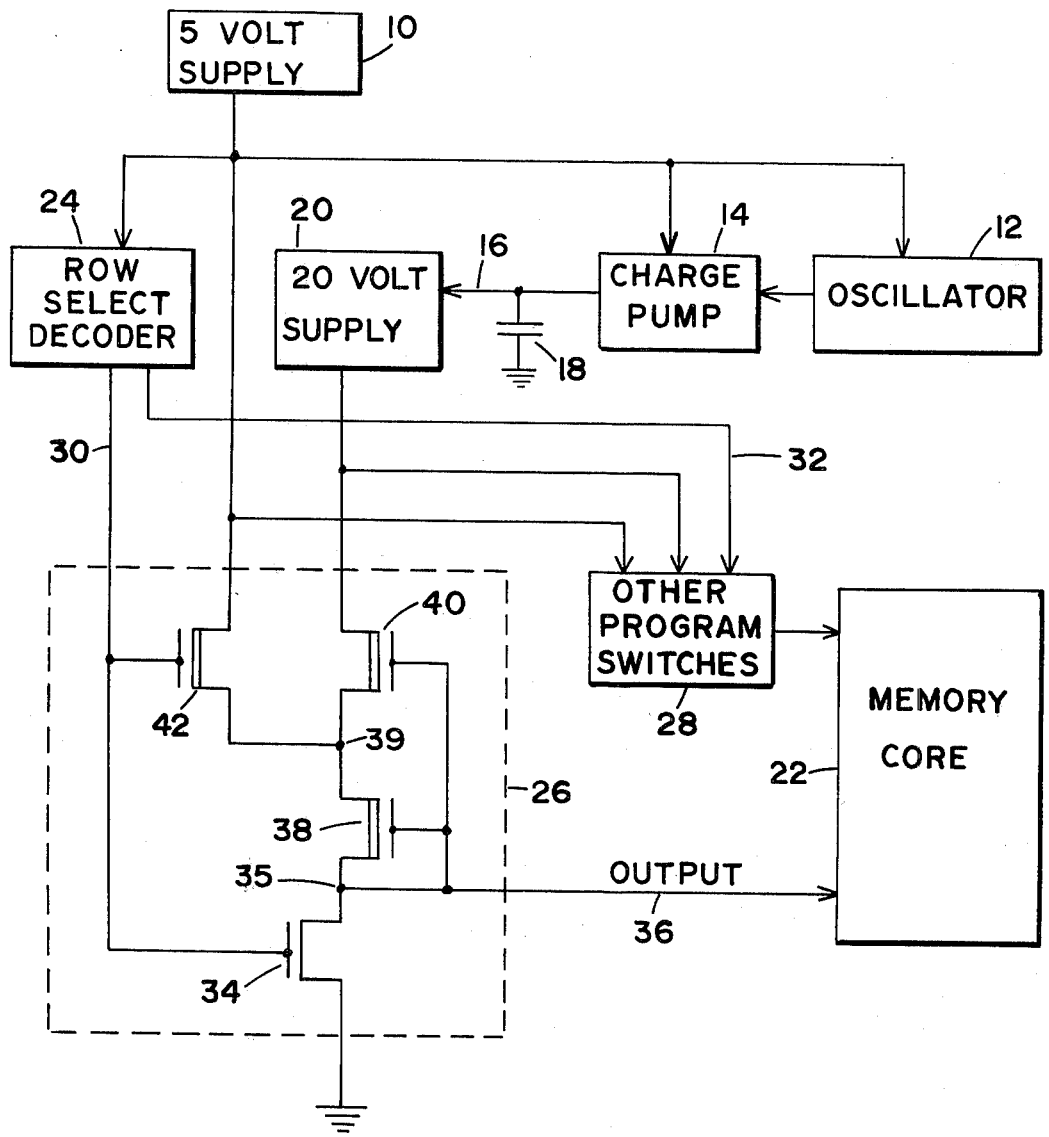

SEMICONDUCTOR MEMORY CORE PROGRAMMING CIRCUIT

BACKGROUND OF THE INVENTION

Electrically alterable read-only semiconductor memories may be constructed using floating gate field effect transistors as storage cells in the core. Each cell is programmed by directing a higher than normal voltage programming pulse to the cell by way of a program line associated with the cell. Typically, the memory normally operates at 5 volts, while 20 volts is used for the programming pulse.

In the prior art, the program lines are normally in electrical communication with a suitable 20 volt source, the 20 volt signal being grounded out by means of a suitable transistor switch when no programming pulse is needed. When programming, only one program line is used at a time. That one program line is activated to produce a programming pulse by turning off the grounding transistor so that the program line may rise to 20 volts. All the rest of the program lines remain grounded so that a small current always flows from the 20 volt source, to these program lines, and thence to ground. In larger memories there may be, for example, 256 program lines conducting a small current most of the time.

In the past, this current drain was too small to be of any concern. However, in the search for better, simpler, easier to use solid state memories, it would be desirable to eliminate the need for an external 20 volt supply and instead generate internally the 20 volts needed for programming, on the chip itself. Such a goal is possible only if the chip's 20 volt generator is not required to supply currents in the magnitudes previously accepted as normal. Hence, there is a need for a circuit that can more efficiently produce the programming pulse without wasting current while in the standby condition. This need is met by the present invention.

SUMMARY OF THE INVENTION

Briefly, my new circuit contemplates a switching arrangement such that the program lines are controlled by the lower 5 volt supply while in the standby condition so as to free up the 20 volt supply for use only with the single program line that is being pulsed at any given moment. Thus, the current demands on the 20 volt supply are dramatically reduced and, as a result, the 20 volt supply may be more easily constructed on the chip itself. When a program pulse is required, the selected program line is decoupled from the 5-volt supply and coupled to the 20-volt supply. These alternative circuit paths are effected by a pair of depletion mode field effect transistors, each one coupled between the program line and one or the other of the voltage supplies in such a way that the conduction of current in one transistor prevents the conduction of current in the other transistor.

BRIEF DESCRIPTION OF THE DRAWING

A schematic diagram of the preferred embodiment of the invention is shown in the drawing.

DESCRIPTION OF THE PREFERRED EMBODIMENT

Referring to the drawing, one design for the part of a memory in which the present inventive circuit would be particularly useful is schematically shown. A 5 volt lower voltage supply 10, which would be external to the memory chip, powers an oscillator 12 and a charge pump 14, which could be on the chip so as to to generate 20 volts internally in the chip. The output on line 16 is smoothed by a filter capacitor 18 so as to produce a stable 20 volt, higher voltage supply 20.

Storage cells in a memory core 22 are selected, in part, by introducing signals thereinto from a row select decoder 24. Decoder 24 selects a particular program switch, such as the program switch delineated by a dashed line 26 or any of a large number of other program switches 28. The selection signal for switch 26 comprises a voltage of either 5 volts or 0 volts, on an input line 30, which may be thought of as first and second condition input signals respectively. Decoder 24 selects other switches on a plurality of lines 32.

If the input is high, or 5 volts, an enhancement mode field effect transistor 34 is caused to conduct so that an output node 35 is connected to ground. Output node 35 is connected to a selected program line 36, so line 36 is at 0 volts and the program line is in a standby condition. A depletion mode field effect transistor 38 is connected between output node 35 and a control node 39. Depletion mode devices, in the preferred embodiment, conduct current unless the gate is more than about 3 volts less than the source. Thus device 38, with its gate connected to its source, is essentially always conducting and may be thought of as simply a resistive current path between nodes 35 and 39.

Another depletion mode device 42 receives the high input on line 30 and is, thus, also conducting so that 5 volt supply 10 is connected to node 39. The conductance of device 42 is chosen to be much larger than that of device 38. Accordingly, most of the voltage drop to ground is across the higher resistance device 38. Thus, control node 39 is very nearly at 5 volts as well. This means that a third depletion mode device 40 is off, or nonconducting, since its gate is connected to the 0 volt node 35 and is, as a result, substantially more than 3 volts under its source at node 39. It may therefore be seen that, in the standby condition, program line 36 is connected only to the lower voltage supply 10 and does not burden higher voltage supply 20.

To generate a programming pulse, decoder 24 switches line 30 low, to 0 volts. Device 34 turns off and decouples node 35 from ground. Device 42 also turns off so that nodes 35 and 39 can equalize voltages through device 38. As node 39 approaches the gate voltage on device 40, device 40 turns on and couples 20 volt supply 20 to program line 36. Now line 36 is connected only to the higher voltage supply 20. During the time that line 36 rises to 20 volts, a transitory current flows, but this current is only a very tiny fraction of the prior art current requirements.

I claim:

1. A switching circuit for producing a programming pulse on a selected program line in the core of an electrically alterable read-only semiconductor memory of the type that utilizes a low voltage supply and a high voltage supply comprising:

an input;

an output node connected to the program line;

first switching means connected between said output node and ground, operable in response to the reception of a first condition input signal from said input to connect said output node to ground, and further operable in response to the reception of a second condition input signal from said input to disconnect said output node from ground; and second switching means connected to said output node and adapted to be connected to either the low voltage supply or the high voltage supply, said second switching means connected to said input such that said second switching means is operable in response to the reception of said first condition input signal to connect said output node only to the low voltage supply and is further operable in response to the reception of said second condition input signal to connect said output node only to said high voltage supply, the conductance of said first switching means being greater than the conductance of said second switching means so as to be able to hold said output node at ground potential when said second switching means connects the output node to the low voltage supply.

2. The circuit of claim 1 wherein said second switching means comprises:

a control node;

a resistive current path between said output node and said control node;

a first switch connected to conduct current between the low voltage supply and said control node, said first switch connected to said input so as to be controlled by said first and second condition input signals therefrom; and a second switch connected to conduct current between the high voltage supply and said control node, said second switch operable in response to the state of conduction of said first switch.

3. The circuit of claim 2 in which said first switch comprises a depletion mode field effect transistor device with its control gate connected to said input.

4. The circuit of claim 2 in which said resistive current path comprises a depletion mode field effect transistor device with its control gate connected to said output node.

5. The circuit of claim 2 in which said second switch comprises a depletion mode field effect transistor device with its control gate connected to said output node.

6. The circuit of claim 5 in which said resistive current path comprises a depletion mode field effect transistor device with its control gate connected to said output mode.

7. The circuit of claim 6 in which said first switch comprises a depletion mode field effect transistor device with its control gate connected to said input.

8. The circuit of claim 7 in which said first switching means comprises on enhancement mode field effect transistor device with its control gate connected to said input.

* * * * *